(12) United States Patent
Anderson et al.

(10) Patent No.: US 6,385,565 B1
(45) Date of Patent: *May 7, 2002

(54) SYSTEM AND METHOD FOR DETERMINING THE DESIRED DECOUPLING COMPONENTS FOR POWER DISTRIBUTION SYSTEMS USING A COMPUTER SYSTEM

(75) Inventors: Raymond E. Anderson, Santa Cruz; Larry D. Smith, San Jose, both of CA (US)

(73) Assignee: Sun Microsystems, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,547

(22) Filed: Jun. 18, 1998

(51) Int. Cl.[7] .............................. G06F 17/50; G06G 7/54
(52) U.S. Cl. ................................. 703/18; 703/14; 716/1
(58) Field of Search ...................... 395/500.39; 703/18, 703/14; 716/1; 361/782; 333/12; 702/65

(56) References Cited

U.S. PATENT DOCUMENTS 4,594,677 A * 6/1986 Barlow ......................... 703/15

(List continued on next page.)

FOREIGN PATENT DOCUMENTS

EP    0 472 317    2/1992

OTHER PUBLICATIONS

Chen et al.; "On–Chip decoupling capacitor optimization for high–performance VLSI"; IEEE Proc. Tech. 95 Symp. VLSI Tech., Syst., and Appl.; pp. 99–103, Jun. 1995.*

(List continued on next page.)

*Primary Examiner*—Kevin J. Teska
*Assistant Examiner*—Hugh Jones
(74) *Attorney, Agent, or Firm*—Conley, Rose & Tayon, PC; B. Noël Kivlin

(57) ABSTRACT

A system and method for using a computer system to determine the desired decoupling components for stabilizing the electrical impedance in the power distribution system of an electrical interconnecting apparatus, including a method for measuring the ESR for an electrical device, a method for determining a number of desired decoupling components for a power distribution system, and a method for placing the desired decoupling components in the power distribution system. The method creates a model of the power distribution system based upon an M×N grid for both the power plane and the ground plane. The model receives input from a user and from a database of various characteristics for a plurality of decoupling components. The method determines a target impedance over a desired frequency range. The method selects decoupling components. The method determines a number for each of the decoupling components chosen. The method places current sources in the model at spatial locations corresponding to physical locations of active components. The method optionally also places a power supply in the model. The method selects specific locations in the model to calculate transfer impedance values as a function of frequency. The method effectuates the model to determine the transfer impedance values as the function of frequency at the specific locations previously chosen. The method then compares the transfer impedance values as the function of frequency at the specific locations to the target impedance for the power distribution system.

28 Claims, 10 Drawing Sheets

U.S. PATENT DOCUMENTS

| | | | | |
|---|---|---|---|---|
| 4,700,317 A | * | 10/1987 | Watanabe et al. | 706/45 |
| 4,754,408 A | * | 6/1988 | Carpenter et al. | 395/500.1 |
| 4,805,113 A | * | 2/1989 | Ishii et al. | 395/500.11 |
| 5,016,087 A | * | 5/1991 | Haug et al. | 257/750 |
| 5,027,089 A | | 6/1991 | Henke | 333/12 |
| 5,031,111 A | * | 7/1991 | Chao et al. | 395/500.089 |
| 5,068,631 A | * | 11/1991 | Vince | 333/181 |
| 5,422,782 A | | 6/1995 | Hernandez et al. | 361/306.2 |
| 5,490,083 A | * | 2/1996 | Toyonaga et al. | 395/500.05 |
| 5,563,801 A | * | 10/1996 | Lee et al. | 395/500.17 |
| 5,566,083 A | | 10/1996 | Fang | 395/500.25 |
| 5,754,826 A | * | 5/1998 | Gamal et al. | 395/500.35 |
| 5,781,446 A | * | 7/1998 | Wu | 395/500.1 |
| 5,796,986 A | * | 8/1998 | Fuller | 395/500.02 |
| 5,798,567 A | * | 8/1998 | Kelly et al. | 257/723 |
| 5,883,814 A | * | 3/1999 | Luk et al. | 395/500.03 |
| 5,898,576 A | * | 4/1999 | Lockwood et al. | 361/782 |
| 5,905,669 A | * | 5/1999 | Horita | 365/51 |
| 5,984,510 A | * | 11/1999 | Guruswamy et al. | 395/500.09 |
| 5,995,734 A | * | 11/1999 | Saika | 395/500.1 |
| 6,195,613 B1 | * | 2/2001 | Roy et al. | 702/65 |
| 6,215,372 B1 | * | 4/2001 | Novak | 333/12 |

OTHER PUBLICATIONS

Yook et al.; "Application of system–level EM modeling to high–speed digital IC packages and PCBs"; IEEE Trans. Microwave Theory and Tech.; pp. 1847–1856; Oct., 1997.*

Van den Berghe et al.; "Power plane resonances as a source of delta_I noise and the influence of decoupling capacitors,"; IEEE 1997 Int. Symp. Elect. Compat.; pp. 145–148; 8/1997.*

Spice User's Guide—pp. 1–132; 1993 (see enclosed Web site printout of four pages indicating the 1993 date).*

Benini et al.; "Distributed EDA tool integration: the PPP paradigm"; ICCD '96; pp. 448–453; Oct., 1996.*

Hubing et al.; "Power bus decoupling on multilayer printed circuit board"; IEEE Trans. Elect. Compat.; pp. 155–166; May, 1995.*

Becker et al.; "Power distribution modeling of high performance first level computer packages"; Elect. Performance of Elect. Pack.; pp. 202–205; Oct., 1993.*

Raghuram et al.; "Implementation of pole–zero analysis in Spice based on the MD method"; Ckts and Systems; pp. 380–383; May, 1991.*

Matsui et al.; "Spice based analysis of radiation from PCBs and related structures"; IEEE 1997 Int. Symp. Elect. Compat.; pp. 320–325; Aug., 1997.*

Divekar et al.; "Automatic generation of Spice macromodels from n–port parameters"; Ckts & Sys.; pp. 670–673; Aug., 1994.*

Djordjevic et al.; "An Investigation of dleta–I noise on integrated circuits"; IEEE Trans. Elect. Compat.; pp. 134–147;May, 1993.*

Divekar et al.; "Simulation of frequency dependent conductor loss in interconnects"; Elect. Comp. & Tech. Conf.; pp. 991–995; May, 1991.*

Raghuram et al.; "Inductance computation of multiple arbitrarily shaped planes"; Elect. Performance of Elect. Pack.; pp. 215–218; Nov., 1994.*

Raghuram et al.; "Efficient computation of ground plane inductances and currents"; Elect. Performance of Elect. Pack.; pp. 131–134; Oct., 1993.*

Divekar et al.; "Analog macromodeling of digital elements in Spice"; Ckts & Sys.; pp. 376–379; May, 1991.*

Wu et al.; "Modeling and simulation of integral decoupling capacitors in single and multichip module electronics packaging"; Elect. Components & Tech. Conf.; pp. 945–948; May, 1994.*

Drewniak et al.; "Modeling power bus decoupling on multilayer printed circuit boards"; Elect. Compatibility—1994 Int. Symp.; pp. 456–461; Aug., 1994.*

Chou; "Effects of on–package decoupling capacitors on the simultaneous switching noise"; Elect. Performance of Elect. Pack.; pp. 55–58; Oct., 1995.*

Hough et al.; "New approaches for the on–chip power switching noise reduction"; Custom INtegrated Ckts–1995 Conf.; pp. 133–136; May, 1995.*

Costa et al.; "Investigation of EMI on multilayer printed circuit boards: Delta/I–noise and power supply coupling"; 1996 Symp. Elect. Compatibility; pp. 436–441; Aug., 1996.*

Wang et al.; "Simultaneous switching noise projection for high–performance SOI chip design."; SOI Conf.; pp. 112–113; Sep., 1996*

Yuan; "Signal integrity analysis of simultaneous switching noise and decoupling capacitors in digital packages and PCB systems"; Elect. Performance of Elect. Pack,; pp. 132–134; Oct., 1996.*

Fang et al.; "Reduction of power and ground noise coupling in mixed signal modules"; Elect. Performance of Elect. Pack.; pp. 90–92; Oct., 1996.*

Goetz; "Time and frequency domain analysis of integral decoupling capacitors"; Comp., Pack., & Manuf. Tech,; pp. 518–522; Aug., 1996.*

Choi et al.; "A simultaneous switching noise analysis of a high speed memory module including the test environments and system level models"; Elect. Performance of Elect. Pack.; pp. 109–112; Oct., 1997.*

Yuan; "Analysis of power/ground noises and decoupling capacitors in printed circuit board systems"; Int. Symp. Elect. Compat.; pp. 425–430; Aug., 1997.*

Takken et al.; "Integral decoupling capacitance reduces multichip module ground bounce"; MCMC–93; pp. 79–84; Mar., 1993.*

Herrell et al.; "EMI and power delivery design in PC systems"; Elect. Performance of Elect. Pack.; pp. 23–26; Oct., 1997.*

Lee et al.; "A comparison of power supply planes in thick and thin film MCMs"; Elect. Performance of Elect. Pack.; pp. 3–6; Nov., 1994.*

Chandra et al.; "Modeling and analysis of computer power systems"; Power Elect. Specialists Conf.; pp. 144–151; Jun., 1989.*

Michelet; "A multi–simulator environment for power supply simulatin"; APEC '91; pp. 278–284; Mar., 1991.*

Xu et al.; "Equivalent circuit models of switches for Spice simulation"; Elect. Lett.; pp. 437–438; Mar., 1988.*

Buttner; "Setting up a retrieval system for design reuse—experience and acceptance"; Euro–DAC '95; pp. 575–578; Sep., 1995.*

Low wt al.; "A low cost MCM design topology–the interconnected mesh power system (IMPS)"; MCMC–95; pp. 200–205; Feb., 1995.*

Smith, "Decoupling Capacitor Calculations for CMOS Circuits," 1994 IEEE, pp. 101–105.

Lee et al., "Modeling and Analysis of Multichip Module Power Supply Planes," IEEE Transactions on Components, Packaging, and Manufacturing Technology—Part B., vol. 18, No. 4, Nov. 1995, pp. 628–639.

Smith, "Packaging and Power Distribution Design Considerations for a Sun Microsystems Desktop Workstation," 1997 IEEE, pp. 19–22.

O'Sullivan et al., "Developing a Decoupling Methodology for Spice for Multilayer Printed Circuit Boards," presented Aug. 1998.

Chen et al., "Optimum Placement of Decoupling Capacitors on Packages and Printed Circuit Boards Under the Guidance of Electromagnetic Field Simulation," 1996 Electronic Components and Technology Conference, pp. 756–760.

Ingels et al., "Design Strategies and Decoupling Techniques for Reducing the Effects of Electrical Interference in Mixed-Mode IC's," IEEE Journal of Solid–State Circuits, vol. 32, No. 7, Jul. 1997, pp. 1136–1141.

Chen et al., "On–Chip Decoupling Capacitor Optimization for High–Performance VLSI Design," 1995 International Symposium on VLSI Technology, Systems, and Applications, pp. 99–103.

International Search Report, Application No. PCT/US99/13802 mailed Dec. 3, 1999.

* cited by examiner

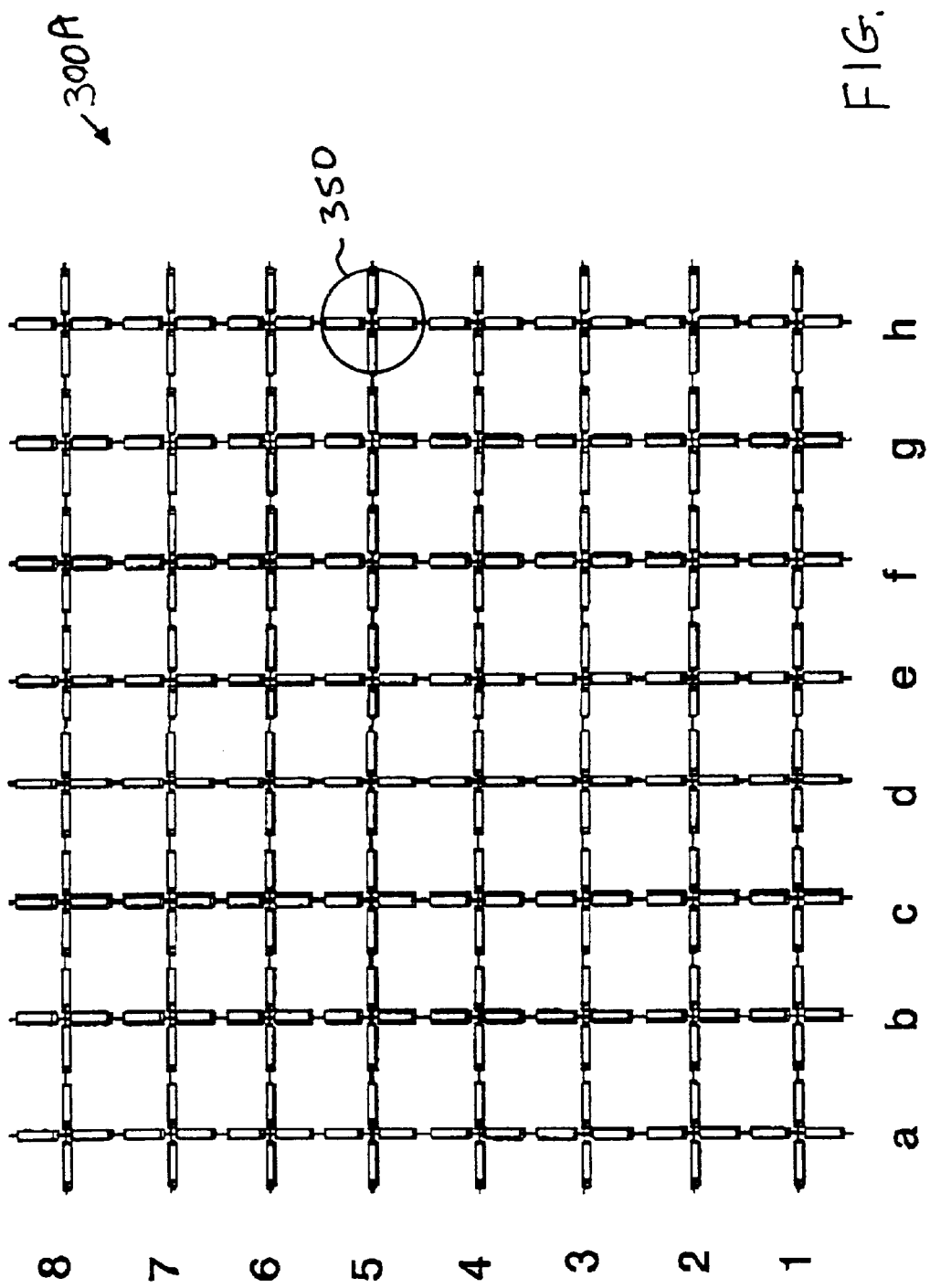

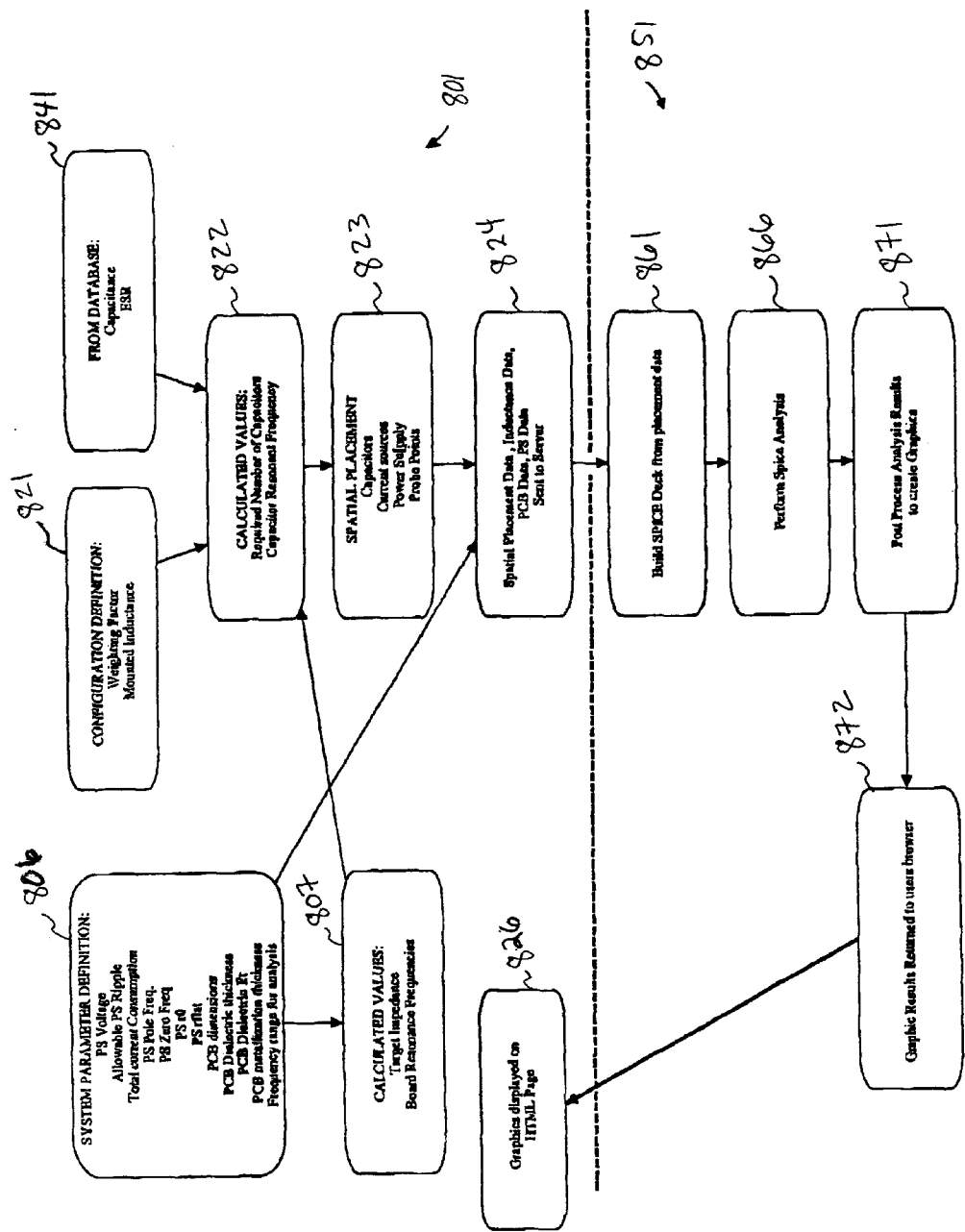

US 6,385,565 B1

SYSTEM AND METHOD FOR DETERMINING THE DESIRED DECOUPLING COMPONENTS FOR POWER DISTRIBUTION SYSTEMS USING A COMPUTER SYSTEM

BACKGROUND OF THE INVENTION

1. Field of the Invention

This invention relates to electronic systems, and more particularly to electrical interconnecting apparatus having continuous planar conductors.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, integrated circuits typically have several layers of conductive traces which interconnect electronic devices formed upon and within a semiconductor substrate. Each layer is separated from adjacent layers by dielectric layers. Within a semiconductor device package, several layers of conductive traces separated by dielectric layers may be used to electrically connect bonding pads of an integrated circuit to terminals (e.g., pins or leads) of the device package. Printed circuit boards (PCBs) also typically have several layers of conductive traces separated by dielectric layers. The conductive traces are used to electrically interconnect terminals of electronic devices mounted upon the PCB.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal Digital electronic systems are continually being produced which operate at higher signal frequencies (i.e., higher speeds). In order for the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions. It is desirable that digital signals be transmitted and received within acceptable tolerances.

A signal launched from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the rise time divided by three, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

A digital signal alternating between the high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of inductance. The voltage across the inductance of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance of the power supply conductor. Similarly, ground bounce is the term used to describe the increase in voltage at the ground terminal of the device due to the flow of transient load current through the inductance of the ground conductor. When the device generates several digital signals having short transition times simultaneously, the power supply droop and ground bounce effects are additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current thereby reducing the amount of transient load current flowing through the power supply conductor. Ground bounce is reduced by using a low inductance ground conductor grid network, or a continuous ground plane having an even lower amount of inductance. Power supply and ground grids or planes are commonly, placed in close proximity to one another in order to further reduce the inductances of the grids or planes.

Electromagnetic interference (EMI) is the term used to describe unwanted interference energies either conducted as currents or radiated as electromagnetic fields. High frequency components present within circuits producing digital signals having short transition times may be coupled into nearby electronic systems (e.g., radio and television circuits), disrupting proper operation of these systems. The United States Federal Communication Commission has established upper limits for the amounts of EMI products for sale in the United States may generate.

Signal circuits form current loops which radiate magnetic fields in a differential mode. Differential mode EMI is usually reduced by reducing the areas proscribed by the circuits and the magnitudes of the signal currents. Impedances of power and ground conductors create voltage drops along the conductors, causing the conductors to radiate electric fields in a common mode. Common mode EMI is typically reduced by reducing the impedances of the power and ground conductors. Reducing the impedances of the power and ground conductors thus reduces EMI as well as power supply droop and ground bounce.

Within the wide frequency range present within electronic systems with digital signals having short transition times, the electrical impedance between any two parallel conductive planes (e.g., adjacent power and ground planes) may vary widely. The parallel conductive planes may exhibit multiple electrical resonances, resulting in alternating high and low impedance values. Parallel conductive planes tend to radiate a significant amount of differential mode EMI at their boundaries (i.e., from their edges). The magnitude of differential mode EMI radiated from the edges of the parallel conductive planes varies with frequency and is directly proportional to the electrical impedance between the planes.

FIG. 1 is a perspective view of a pair of 10 in.×10 in. square conductive planes 110 and 120 separated by a fiberglass-epoxy composite dielectric layer. Each conductive plane is made of copper and is 0.0014 in. thick. The fiberglass-epoxy composite layer separating the planes has a dielectric constant of 4.0 and is 0.004 in. thick. If a 1 ampere constant current is supplied between the centers of the rectangular planes, with a varying frequency of the current, the magnitude of the steady state voltage between the centers of the rectangular planes can be determined 130.

The electrical impedance between the parallel conductive planes of FIG. 1 varies widely at frequencies above about 200 MHz. The parallel conductive planes exhibit multiple electrical resonances at frequencies between 100 MHz and 1 GHz and above resulting in alternating high and low impedance values. The parallel conductive planes of FIG. 1 would also radiate substantial amounts of EMI at frequencies where the electrical impedance between the planes anywhere near their peripheries is high.

The above problems are currently solved in different ways at different frequency ranges. At low frequency, the power supply uses a negative feedback loop to reduce fluctuations. At higher frequencies, large value bypass (i.e. decoupling) capacitors are placed near devices. At the highest frequencies, up to about 200–300 MHz, very small bypass capacitors are placed very close to devices in an attempt to reduce their parasitic inductance, and thus high frequency impedance, to a minimum value. By Nov. 2, 1994, the practical upper limit remained around 200–300 MHz as shown by Smith [Decoupling Capacitor Calculations for CMOS Circuits; 101–105 in Proceedings of $3^{rd}$ Topical Meeting on Electrical Performance of Electronic Packaging of the Institute of Electrical and Electronics Engineers, Inc.].

The power distribution system was modeled as shown in FIG. 2. A switching power supply 210 supplies current and voltage to a CMOS chip load 220. In parallel with the power supply 210 and the load 220 are decoupling capacitors 215 and the PCB 225 itself, with its own capacitance. Smith [1994] teaches that decoupling capacitors are only necessary up to 200–300 MHz, as the target impedances are rarely exceeded above that frequency. This upper limit changes over time as the clock frequencies increase and the allowable voltage ripple decreases. Determining the proper values for decoupling capacitors and the optimum number of each has been a "trial and error" process, which relies on the experience of the designer. There are no known straightforward rules for choosing decoupling capacitors for all frequency ranges.

It would thus be desirable to have a method for designing the power distribution system and determining the desired decoupling components for stabilizing the electrical impedance in the power distribution system. The method is preferably automatable using a computer system to perform calculations.

SUMMARY OF THE INVENTION

The problems outlined above are in large part solved by a system and method for using a computer system to determine the desired decoupling components for stabilizing the electrical impedance in the power distribution system of an electrical interconnecting apparatus including a pair of parallel planar conductors separated by a dielectric layer. The electrical interconnecting apparatus may be, for example, a PCB, a semiconductor device package substrate, or an integrated circuit substrate. The present method includes creating a model of the power distribution system based upon an M×N grid for both the power plane and the ground plane. The model is preferably based upon a fixed grid that adapts automatically to the actual physical dimensions of the electrical interconnecting apparatus. The model preferably also calculates the system response to chosen decoupling components in both single node and M×N node versions.

The model receives input from a user and from a database of various physical and/or electrical characteristics for a plurality of decoupling components. Various characteristics of interest include physical dimensions, type, and thickness of dielectric, method and materials of manufacture, capacitance, mounted inductance, and ESR. The desired characteristics are preferably saved in a database for corrections, additions, deletions, and updates.

In one embodiment, the model of the power distribution system is in a form of a plane including two dimensional distributed transmission lines. The model of the power distribution system may comprise a plurality of the following: one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling components. In one embodiment, M and N have a uniform value. In various embodiments, the active components act as current sources or sinks, and may include processors, memories, application specific integrated circuits (ASICs), logic ICs, or any device that converts electrical energy into information. Preferably, a total sum of all values of the current sources in the model is scaled to equal one ampere.

In one embodiment, the model of the power distribution system is operable for determining the decoupling components for a frequency range above approximately a lowest board resonance frequency. In another embodiment, the model of the power distribution system is operable for determining the decoupling components for a frequency range above a highest resonance frequency from all resonance frequencies of the decoupling components.

The method preferably includes determining a target impedance for the power distribution system at a desired frequency or over a desired frequency range. The target impedance is preferably determined based upon such factors as power supply voltage, total current consumption, and allowable voltage ripple in the power distribution system. Preferably, determining the target impedance for the power distribution system comprises the quotient of power supply voltage multiplied by allowable voltage ripple divided by total current.

The frequency range may start at dc and rise to several GHz. In one embodiment, the model of the power distribution system is operable for determining the decoupling components for a frequency range above approximately a lowest board resonance frequency. In another embodiment, the model of the power distribution system is operable for determining the decoupling components for a frequency range above a highest resonance frequency from all resonance frequencies of the decoupling components.

The method preferably selects one or more decoupling components from a plurality of possible decoupling components. Preferably, the decoupling components are capacitors with an approximate mounted inductance and an ESR. In one embodiment, a range of the values of the capacitors is chosen such that a superposition of impedance profiles provide an impedance at or below the target impedance for the power distribution system over the frequency range of interest. In one embodiment, the impedance profiles of the plurality of possible decoupling components are compared to resonance frequencies for the power distribution system. The decoupling components have resonance frequencies that substantially correspond to the resonance frequencies of the power distribution system in the frequency range of interest.

The method preferably determines a number for each of the one or more decoupling components chosen to be included as part of the power distribution model. In one embodiment, the number of the various decoupling components is chosen based upon the frequency range of interest and the impedance profiles of a plurality of possible decoupling components. In another embodiment, the number of a particular one of the decoupling components is chosen to have approximately equal value of a next larger integer of the quotient obtained from dividing the ESR for the particular decoupling components by the target impedance for the power distribution system. In still another embodiment, the number of particular decoupling components has approximately equal value of impedance to the target impedance for the power distribution system when the number of the particular decoupling components are placed in parallel. In one embodiment, determining the number for the each of the decoupling components occurs before effectuating the model of the power distribution system to determine the transfer impedance values as the function of frequency at the one or more specific locations.

The method preferably places one or more current sources in the model of the power distribution system at one or more spatial locations corresponding to one or more locations of active components. The method also preferably also preferably places the decoupling components in the model of the power distribution system at nodal points that couple the M×N grid for the power plane and the corresponding M×N grid for the ground plane. In one embodiment, the method places a power supply in the model of the power distribution system at a fixed location on the power plane. The power supply is preferably comprised in the model as one or more pole frequencies, one or more zero frequencies, and one or more resistances.

The method preferably selects one or more specific locations in the model of the power distribution system to calculate transfer impedance values as a function of frequency. The method preferably effectuates the model of the power distribution system to determine the transfer impedance values as the function of frequency at the one or more specific locations previously chosen. The method then preferably compares the transfer impedance values as the function of frequency at the one or more specific locations to the target impedance for the power distribution system. Preferably, the method determines a bill of goods for the power distribution system based upon the results of effectuating the model.

In various embodiments, the method for determining decoupling components for a power distribution system includes determining a preferred or optimum number of decoupling components for a power distribution system. A preferred method for determining a number of decoupling components for a power distribution system is also disclosed. For a given frequency or frequency range, the method for determining a number of decoupling components for a power distribution system comprises selecting a particular one of the decoupling components based upon a mounted inductance of each of the decoupling components. The mounted inductance comprises an indication of a resonance frequency of that particular one of the decoupling components. The method also compares an individual decoupling component impedance of each of the decoupling components to the target impedance. The method then selects the number of the particular one of the decoupling components which provides a total impedance at or below the target impedance at the given frequency or frequency range.

In one embodiment, if the impedance of the particular decoupling component is greater than the target impedance, then the method calculates the desired number of the particular decoupling components in a parallel configuration. In embodiments that determine a number of each of a plurality of decoupling components for a power distribution system for a given frequency range, a plurality of decoupling components are chosen as necessary to provide a total impedance at or below the target impedance for the given frequency range.

In various embodiments, the method for determining decoupling components for a power distribution system includes determining placement information for preferred or optimum number of decoupling components for a power distribution system. A preferred method for determining placement of one or more decoupling components in a power distribution system is also given. In one embodiment, each of the one or more decoupling components includes a respective resonance frequency and a respective equivalent series resistance at the respective resonance frequency. The power distribution system includes a target impedance, and the electrical interconnecting apparatus has at least a first dimension. The method determines one or more board resonance frequencies. A first board frequency corresponds to the first dimension. The method also selects one or more first decoupling components from a plurality of possible decoupling components such that the first decoupling components have their respective resonance frequency at approximately the first board resonance frequency. The method then places the first decoupling components on a location of the electrical interconnecting apparatus corresponding to the first dimension. Additional dimensions of the electrical interconnecting apparatus may also require their own decoupling components.

In the embodiment where the electrical interconnecting apparatus has approximately rectangular dimensions, the first dimension is preferably an effective length and the second dimension is preferably an effective width. The preferred location for placing the decoupling component for the first dimension comprises a first edge on the effective length, while the preferred location for placing the decoupling component for the second dimension comprises a second edge on the effective width.

In one embodiment, when the electrical interconnecting apparatus has at least one location for at least a first active device, the method further comprises placing one or more second decoupling components on the electrical interconnecting apparatus at the at least one location for at least the first active device. Additional decoupling components are also placed on the electrical interconnecting apparatus as needed for additional active devices. The preferred location for placing decoupling components for active devices is at or near the active devices.

In one embodiment, the method includes selecting the decoupling components from a plurality of possible decoupling components such that the decoupling components have the respective resonance frequency at approximately the first operating frequency of the active device. Additional decoupling components may be selected and placed based upon the harmonics of the operating frequency, as desired.

BRIEF DESCRIPTION OF THE DRAWINGS

Other objects and advantages of the invention Will become apparent upon reading the following detailed description and upon reference to the accompanying drawings in which:

FIG. 3A is a top view of one embodiment of a model of a power distribution system;

FIG. 8B is a flowchart of an embodiment of the method for determining decoupling components for a power distribution system using the computer system of FIG. 8A.

Figure 1:
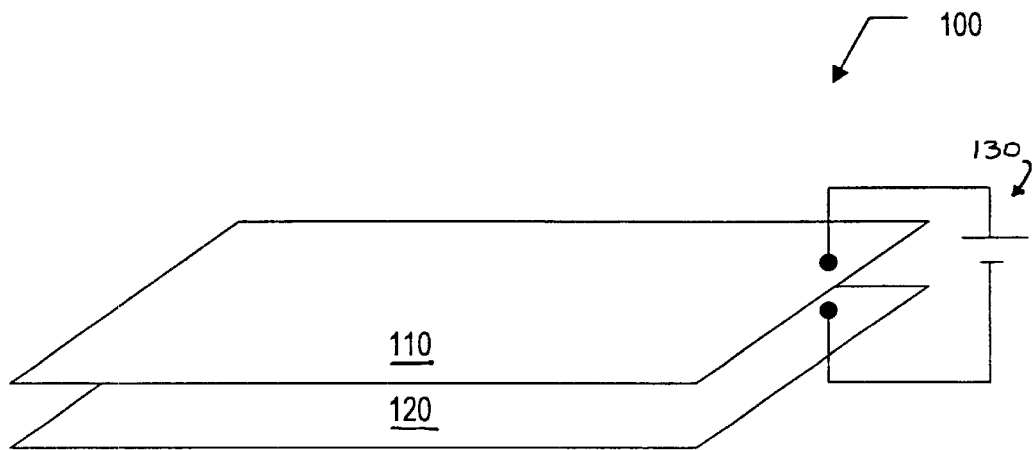
FIG. 1 is a perspective view of a representative electrical interconnecting apparatus comprising a prior art pair of 10 in.×10 in. square conductive planes separated by a fiberglass-epoxy composite dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following publications are hereby incorporated by reference in their entirety:

"Decoupling Capacitor Calculations for CMOS Circuits" by Larry D. Smith, IEEE Proceedings of the $3^{rd}$ Topical Meeting on Electrical Performance of Electronic Packaging, Nov. 2, 1994; and "Packaging and Power Distribution Design Considerations for a Sun Microsystems Desktop Workstation" by Larry D. Smith, IEEE Proceedings of the $6^{th}$ Topical Meeting on Electrical Performance of Electronic Packaging, Oct. 27, 1997.

FIG. 3—Power Distribution System Model

FIG. 3A is a top view of a simplified schematic of one embodiment of a model of a power distribution system. As shown, the model comprises a grid 300A of transmission line segments. The segments are grouped into unit cells 350. As shown, there are eight columns labeled "a" through "h", as well as eight rows labeled, from the bottom to the top, "1" through "8". The model preferably comprises a SPICE array of transmission lines in a fixed topology (i.e. in an 8×8 grid). The transmission lines are variable lengths such that the fixed topology may be used on electrical connecting device of any physical dimensions. It is noted that other embodiments of the power distribution system are contemplated, such as an elliptical model based on a "wheel and spoke" geometry.

Figure 3B:
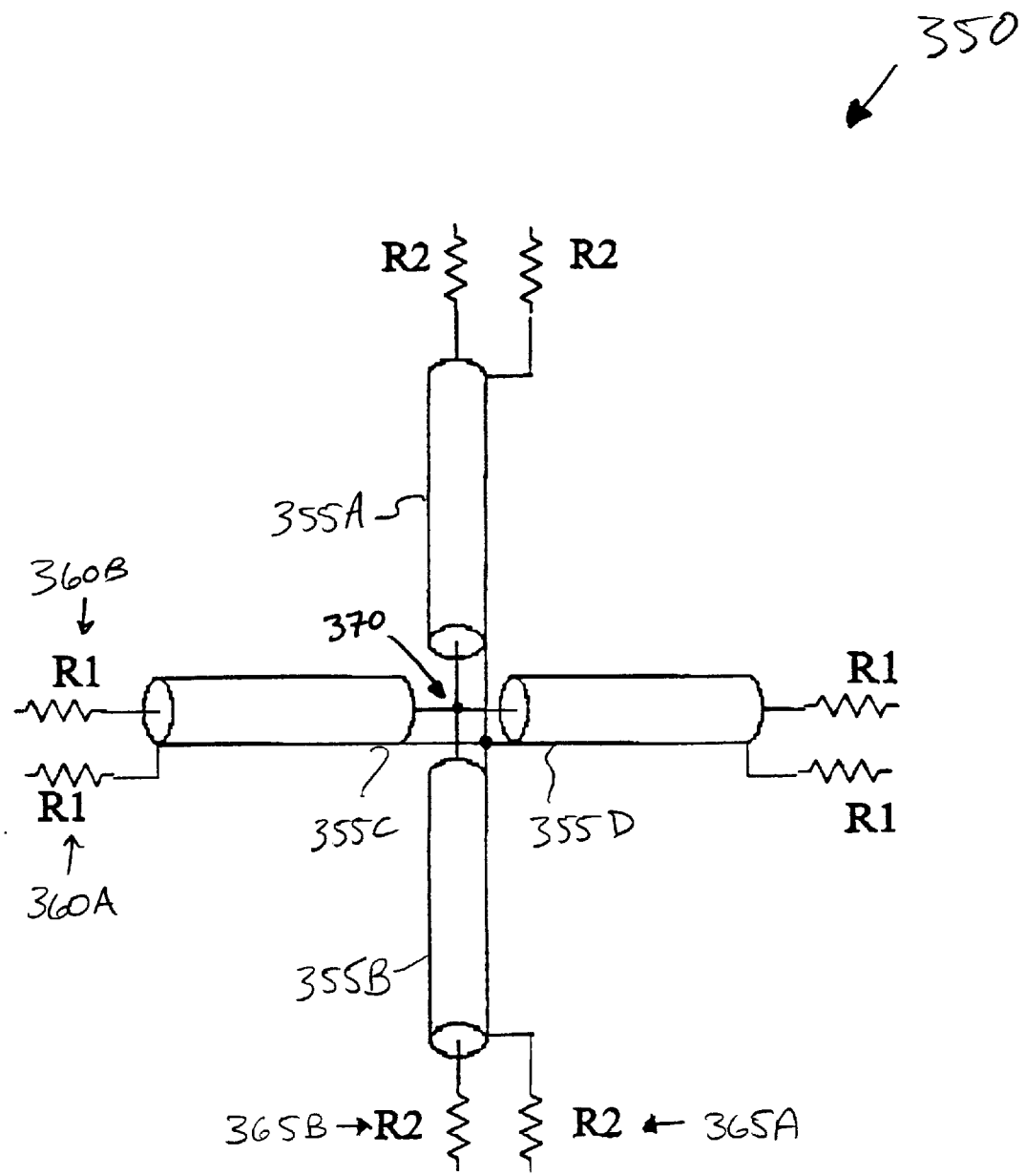
FIG. 3B is an embodiment of a unit cell of the power distribution system model shown in FIG. 3A.

FIG. 3B illustrates a close up view of the unit cell 350 from FIG. 3A. As shown, the unit cell 350 is comprised of four transmission lines 355A–355D. The four transmission lines 355 connect together at nodal point pair 370, also referred to as node 370. As shown, connections to the center conductors represent plane 1, while connections to shield are plane 2. Note that the model is balanced, therefore either plane 1 or plane 2 may be power or ground, as desired. Transmission lines 355A and 355B are preferably described with a width impedance "$Z_w$" and a width time delay "$t_{DW}$". Transmission lines 355C and 355D are preferably described with a length impedance "$Z_L$" and a length time delay "$t_{DL}$". $R_1$ and $R_2$ are resistances. The constants, parameters and variables of interest, as well as the equations that define and relate these quantities, along with the preferred units are given below:

"L" is the length of the plane (inches)

"W" is the width of the plane (inches)

"thk" is the thickness of the dielectric (mils)

"cu" is the metalization thickness (mils)

"velc" is the speed of light in a vacuum (inches/sec)

"hertz" is the frequency variable

"$\epsilon_0$" is the vacuum dielectric constant (permittivity) (picofarads/inch)

"$\epsilon_r$" is the dielectric constant

"$\sigma$" is the copper conductivity (per ohm/mils)

"$\mu_0$" is the permeability of a vacuum (henries/mil)

"vel" is the velocity of a signal on the electrical interconnecting apparatus $$vel = velc/\sqrt{\epsilon_r}$$

"n" is the size of the grid, i.e. 8 as shown

"asp" is the aspect ratio of the grid, asp=L/W

"factor" is a calibration factor to compensate for capacitive loading $$factor = 1/\sqrt{2}$$

"$t_{VFL}$" is the time of flight for the length dimension, $$t_{FL} = L/vel$$

"$t_{FW}$" is the time of flight for the width dimension, $$t_{FW} = W/vel$$

"$t_{DL}$" is the transmission line delay time for the length dimension $$t_{DL} = t_{FL}/(2n) \text{ factor}$$

"$t_{DW}$" is the transmission line delay for the width dimension $$t_{DW} = t_{FW}/(2n) \text{ factor}$$

"cap" is the parallel plate capacitance of the plane $$cap = (\epsilon_0 \epsilon_r LW)/(10^{-9} thk)$$

"$Z_L$" is the impedance in the length direction $$Z_L = (n=cap)(t_{FL}=asp*t_{FW}) \text{ factor}$$

"$Z_W$" is the impedance in the width direction, $$Z_W = Z_L = asp$$

"$R_1$" is the smaller of:

$$R_{1A} = ((L/W)/2)*(1/(\sigma*(1/\sqrt{hertz*\pi\mu_0\sigma})))$$

$$R_{1B} = ((L/W)/2)*(1/(\sigma*cu))$$

"$R_2$" is the smaller of:

$$R_{2A} = ((W/L)/2)*(1/(\sigma*(1/\sqrt{hertz*\pi\mu_0\sigma})))$$

$$R_{2B} = ((W/L)/2)*(1/(\sigma*cu))$$

The model represents an electrical interconnecting apparatus, which may be, for example, a printed circuit board (PCB), a semiconductor device package substrate, or an integrated circuit substrate. The present method includes creating a model of the power distribution system based upon an M×N grid for both the power plane and the ground plane. The model is preferably based upon a fixed grid that adapts automatically to the actual physical dimensions of the electrical interconnecting apparatus. The model preferably also calculates the system response to chosen decoupling components in both single node and M×N node versions.

The model receives input from a user and from a database of various physical and/or electrical characteristics for a plurality of decoupling components. Various characteristics of interest include physical dimensions, type and thickness of dielectric, method and materials of manufacture, capacitance, mounted inductance, and equivalent series resistance (ESR). The desired characteristics are preferably saved in a database for corrections, additions, deletions, and updates.

In one embodiment, the model of the power distribution system is in a form of a plane including two dimensional distributed transmission lines. The model of the power distribution system may comprise a plurality of the following one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling components. In a preferred embodiment, M and N have a uniform value, 8 as shown. In various embodiments, the active components act as current sources or sinks, and may include processors, memories, application specific integrated circuits (ASICS), or logic ICs. Preferably, a total sum of all values of the current sources in the model is scaled to equal one ampere.

In one embodiment, the model of the power distribution system is operable for determining the decoupling components for a frequency range above approximately a lowest board resonance frequency. Additional information may be found with respect to FIG. 5 below. In another embodiment, the model of the power distribution system is operable for determining the decoupling components for a frequency range above a highest resonance frequency from all resonance frequencies of the decoupling components.

In one embodiment, the model uses a weighting factor in determining a number of a particular decoupling component to include in the model. The weighting factor is a dimensionless non-zero positive number. In the frequency range where EMI is most important, the preferred weighting factor is 0.2. The EMI frequency range is preferably above approximately 200 MHz. Preferably, the weighting factor is 1.0 in a frequency range where signal integrity is most important. The frequency range where signal integrity is important is preferably approximately 10 MHz up to approximately 200–300 MHz. The weighting factor is preferably 2.0 at all active device operating frequencies and harmonics of the active device operating frequencies. In a preferred embodiment, the model includes a frequency dependent skin effect loss.

FIG. 4—Grid

Figure 4:
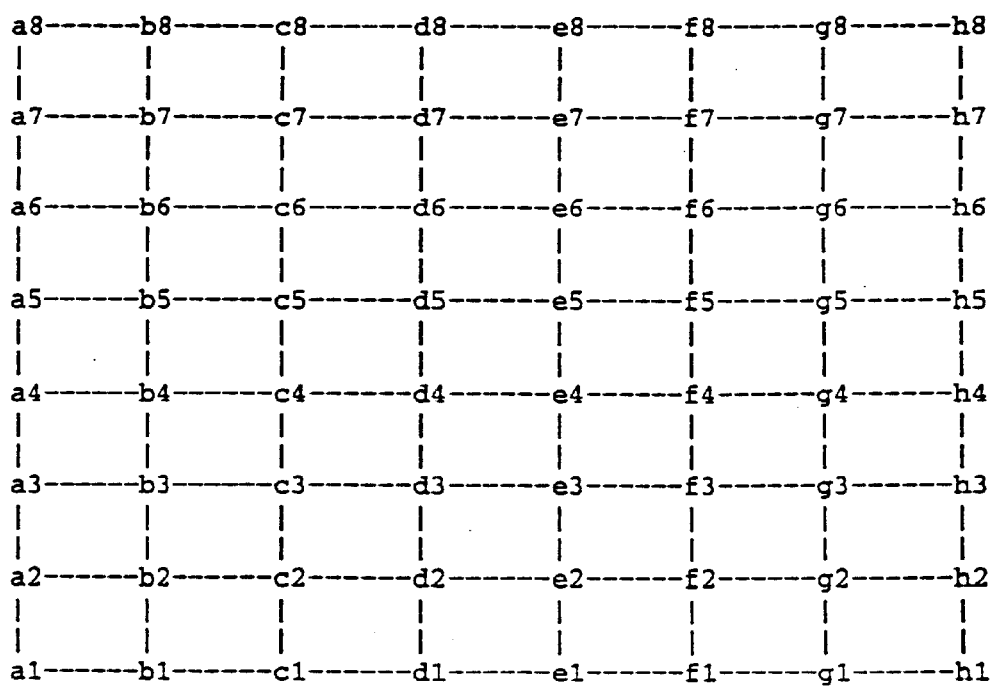
FIG. 4 is a representative grid of the nodal interconnections of the model of the power distribution system shown in FIG. 3A.

FIG. 4 illustrates the 8×8 grid 300B of nodes 370 that are used to model the power and ground planes with the respective designations of a1 through h8, in a preferred embodiment. This grid 300B is used to determine the locations of the decoupling components for the power distribution system.

Figure 5:
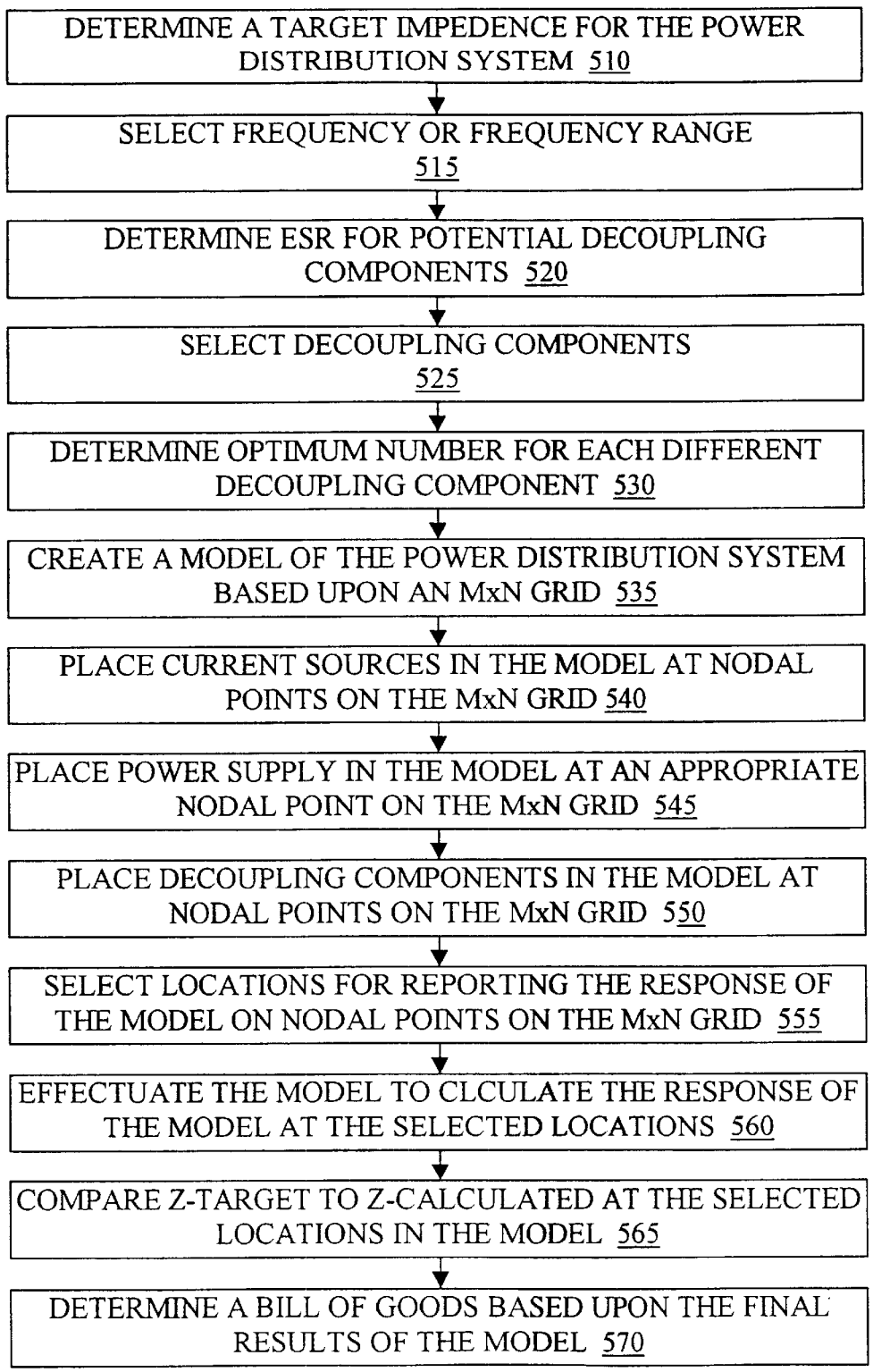
FIG. 5 is a flowchart of an embodiment of a method for determining decoupling components for a power distribution system.

FIG. 5—Method for Determining Decoupling Components

FIG. 5 illustrates a flowchart of an embodiment of a method for determining decoupling components for a power distribution system. The method is shown as a straight through method with no loop-back. In other embodiments, the method includes feedback loops at various stages to change previous inputs.

The method determines a target impedance for the power distribution system 510. The target impedance is preferably determined at a desired frequency or over a desired frequency range. The target impedance is determined based upon such factors as power supply voltage, total current consumption, and allowable voltage ripple in the power distribution system. Preferably, determining the target impedance for the power distribution system comprises the quotient of power supply voltage multiplied by allowable voltage ripple divided by total current. In a preferred embodiment, the total current is normalized to one ampere. The target impedance may be comprised in a group of known system parameters. Other known system parameters may include one or more power supply characteristics, the allowable voltage ripple, the total current consumption of all devices, one or more physical dimensions of the power distribution system, physical location constraints on where devices may be placed in the power distribution system, and/or a frequency or frequency range of interest.

The method preferably selects a frequency range of interest 515. The frequency range may start at do and rise up to or above the gigahertz range. In one embodiment, the model of the power distribution system is operable for determining the decoupling components for a frequency range above approximately a lowest board resonance frequency. In another embodiment, the model of the power distribution system is operable for determining the decoupling components for a frequency range above a highest resonance frequency from all resonance frequencies of the decoupling components. As mentioned above, the frequency range of interest may be comprised in the known system parameters. In one embodiment, the frequency range of interest determines the output of the method by limiting the frequency range over which the system impedance is calculated in the model.

The method preferably determines the ESR, for the plurality of decoupling components 520. The decoupling components are preferably capacitors, but other devices with desirable capacitive and inductive values may be used. The ESR is preferably included in the database of various physical and/or electrical characteristics for the plurality of decoupling components. Various other characteristics of interest may include physical dimensions, type and thickness of dielectric, method and materials of manufacture, capacitance, and mounted inductance. The desired characteristics are preferably saved in the database for corrections, additions, deletions, and updates. Additional details concerning determining the ESR for the plurality of decoupling components 520 is given below with respect to FIG. 6.

The method preferably selects one or more desirable decoupling components from a plurality of possible decoupling components 525. Preferably, the decoupling components are capacitors with an approximate mounted inductance and an ESR. In one embodiment, a range of the values of the capacitors is chosen such that a superposition of impedance profiles provide an impedance at or below the target impedance for the power distribution system over the frequency range of interest. In another embodiment, the impedance profiles of the plurality of possible decoupling components are compared to resonance frequencies for the power distribution system.

The decoupling components have resonance frequencies, which should substantially correspond to the resonance frequencies of the power distribution system in the frequency range of interest. Resonance frequencies for the decoupling components are preferably chosen to approximately correspond to board resonance frequencies, operating frequencies and harmonics of active devices, including power supply, on the electrical interconnecting apparatus, and interaction resonance frequencies, high frequency response frequencies from interactions of the various components in the power distribution system. In various embodiments, the capacitors are selected by the type of manufacture, such as the dielectric composition, or a physical or electrical characteristic value, such as the mounted inductance. The mounted inductance includes the geometry and physical coupling to the electrical interconnecting apparatus. The resonance frequency for a capacitor may be calculated from the mounted inductance and the capacitance using the following formula:

$$f_{resonance} = 1/(2\pi\sqrt{LC})$$

The impedance of the capacitor at the resonance frequency is the ESR it is noted that ceramic capacitors often have a deep cusp at the resonance frequency. Tantalum capacitors often have a deep broad bottom with a variable slope as a function of frequency.

Once the desired decoupling components have been selected, the optimum or desired number of each of the particular ones of the decoupling components are determined by the method 530. In one embodiment, the number of each of the particular ones of the decoupling components are determined by the method 530 in response to the method selecting one or more desirable decoupling components from a plurality of possible decoupling components 525.

The method, therefore, preferably determines a number (i.e. a counting number, 1, 2, ...) for each of the one or more decoupling components chosen to be included as part of the power distribution model 530. In other words, the method determines how many of each particular decoupling component to include in the model. In one embodiment, the number of the various decoupling components is chosen based upon the frequency range of interest and the impedance profiles of the plurality of possible decoupling components. In another embodiment, the number of a particular one of the decoupling components is chosen to have approximately equal value of a next larger integer of the quotient obtained from dividing the ESR for the particular decoupling components by the target impedance for the power distribution system.

In still another embodiment, the number of a particular decoupling components has approximately equal value of impedance to the target impedance for the power distribution system when the number of the particular decoupling components are placed in parallel. In one embodiment, determining the number for the each of the decoupling components 530 occurs before effectuating the model of the power distribution system to determine the transfer impedance values as the function of frequency at the one or more specific locations 560. In another embodiment, the number of a particular one of the one or more decoupling components has approximately equal value of a next larger integer of the quotient obtained from dividing an equivalent series resistance for the particular one of the one or more decoupling components by the target impedance for the power distribution system. In still another embodiment the number of decoupling components is determined for all decoupling components 530 in the plurality of possible decoupling components (i.e. in the database described above) before selecting the decoupling components to be used in the model 525. The calculations for selecting decoupling components 525 and determining the number of each of the selected decoupling components 530 are preferably performed by a computer system. Additional details may be gleaned below with respect to FIGS. 7–9.

The method creates (i.e. realizes or implements) the model of the power distribution in 535. The preferred model is described above with respect to FIGS. 3A and 3B. In a preferred embodiment, the model is computerized. Additional details may be found elsewhere in this disclosure.

The method next populates the model of the power distribution system. That is, the method adds to the model those devices that, are coupled to the electrical interconnecting apparatus. The method places current sources (or sinks) in the model at nodal points 370 on the M×N grid 300B in 540. The current sources are placed at one or more spatial locations corresponding to one or more locations of active components. Examples of active components include processors, memories, application specific integrated circuits (ASICs), or logic integrated circuits (logic ICs). It is noted that active devices may act as current sources or sinks. The total value of the current sources is preferably scaled to one ampere. The numbers, current ratings and strengths, and locations of the current sources may be included in the known system parameters. In one embodiment, the placing of the current sources is performed by the computer system based on the known system parameters.

Optionally, the method places one or more power supplies in the model placed at nodal points 370 representing one or more spatial locations on the electrical interconnecting apparatus 545. The power supply is comprised in the model as one or more pole frequencies, one or more zero frequencies, and one or more resistances. Preferably, one pole frequency, one zero frequency, and two resistances are used, along with the output voltage. Typically, the parameters are treated as a series with one resistance in parallel with the zero frequency. The parameters and locations of any power supplies are usually part of the known system parameters. In one embodiment, placing the power supply in the model is performed by the computer system. Additional details may be found with respect to FIGS. 8–9.

The method also preferably places the decoupling components in the model of the power distribution system at nodal points 370 that couple the M×N grid 300 for the power plane and the corresponding M×N grid for the ground plane 550. Particular decoupling components should optimally be placed as close as possible to those device locations which have resonance frequencies in the frequency range of interest. Resonance frequencies for the power distribution system should be interpreted in this disclosure to include board resonance frequencies, operating frequencies and harmonics of active devices on the electrical interconnecting apparatus, and high frequency response frequencies from interactions of the various components in the power distribution system. High frequency response is often highly spatially dependent.

Board resonance frequencies are a function of the physical dimensions of the power distribution system and the dielectric constant of the dielectric that separates the power plane from the one or more ground planes. The board resonance frequencies of interest in a preferred embodiment include the half-, full-, three-half-, second-full-, and five-half-wave resonance frequencies for both the length and the width. The values for these board resonance frequencies are given by the appropriate multiples of vel, L, and W as defined earlier. For example, the half wave resonance for the length is ($\frac{1}{2}$)*vel*L. The three-half wave resonance for the width is ($\frac{3}{2}$)*vel*W.

To suppress the board resonance frequencies, decoupling components are placed in the power distribution system at locations that provide a low impedance shunt for high impedance resonance nodes (i.e. high voltage standing wave points). By noting where the board resonance has one or more maximums, the placement follows at or near those corresponding locations. For a half wave resonance, the decoupling components should be placed along the edges of the power distribution system or the electrical connecting apparatus. Since the apparatus is not one dimensional, the decoupling components are placed on the line resulting from the intersection of the resonance and the plane defining the power distribution system. Therefore, the decoupling components for the length half-wave resonance are preferably placed along the edges on the width of the power distribution system. For the full wave resonance, the decoupling components are preferably placed along the edges and along the center axis of the power distribution system. For the three-half-wave resonance, the decoupling components are preferably placed along the edges and at points one-third in from each edge. For the second-full-wave resonance, the decoupling components are preferably placed along the edges, along the center axis, and at points one-fourth in from each edge. For the five-half-wave resonance, the decoupling components are preferably placed along the edges, at points one-fifth in from each edge, and at points two-fifths in from each edge. It is noted that a square electrical connecting apparatus the lengthwise and widthwise resonances will be at the same frequencies and have maximums at corresponding locations. It is also noted that similar relations are found with respect to an electrical connecting apparatus having a different geometry, such as elliptical, etc.

Resonance or operating frequencies for the power supply are usually low enough that the capacitance can be treated as a lumped capacitance. Thus decoupling components for the power supply may be placed anywhere on the electrical interconnecting apparatus. Spatial limitations on locations must always be observed. This means that some decoupling components will be placed farther away from the noise source than optimum. The model will often indicate that additional ones of those decoupling components will need to be placed on the electrical interconnecting apparatus at the farther away location. In one embodiment placement of decoupling components 550 is input to the computerized model. Additional details may be found in the descriptions of FIGS. 8–9.

The method preferably selects one or more specific locations in the model of the power distribution system to calculate transfer impedance values 555 as a function of frequency. The specific locations preferably include all 64 nodes on the 8×8 grid. To shorten execution time of the computer system, other numbers of nodes may be chosen. It is noted that as the number of nodes increases, the model will accurately predict the board resonance frequencies up to higher frequencies. In one embodiment the model is run twice, once with a single specific node with all components placed on the single specific node and then a second time with the power distribution system filling the entire 64 nodes of the model. The specific locations are usually part of the known system parameters. It is noted that if fewer numbers of nodes are chosen, the usable bandwidth of the model will be lower.

The method preferably effectuates the model of the power distribution system to determine the transfer impedance values as the function of frequency at the one or more specific locations previously chosen 560. In one embodiment, the model is effectuated by running computer programs on the computer system. Additional details may be found in the description of FIGS. 8–9.

The method then preferably compares the transfer impedance values as the function of frequency at the one or more specific locations to the target impedance for the power distribution system 565. In one embodiment, one or more graphs are output which illustrates the transfer impedance (i.e., values as a function of frequency. Preferably, the graphs are computer generated. In another embodiment, the method outputs a resultant noise level for the power distribution system due to the current sources and the decoupling components at the specific locations. In still another embodiment, the method outputs the plurality of resultant impedances at the plurality of specific locations in the power distribution system dynamically as a function of frequency, Preferably, the method determines at least a portion of a "bill of goods" for the power distribution system based upon the results of effectuating the model 570. The bill of goods lists all relevant information from the selecting and placing of the various decoupling components. The bill of goods is preferably sufficient to allow mass production of the electrical interconnecting apparatus modeled to occur with proper decoupling of the final product. Although the method is shown in flowchart form, it is noted that portions of FIG. 5 may occur concurrently or in different orders.

Figure 6:
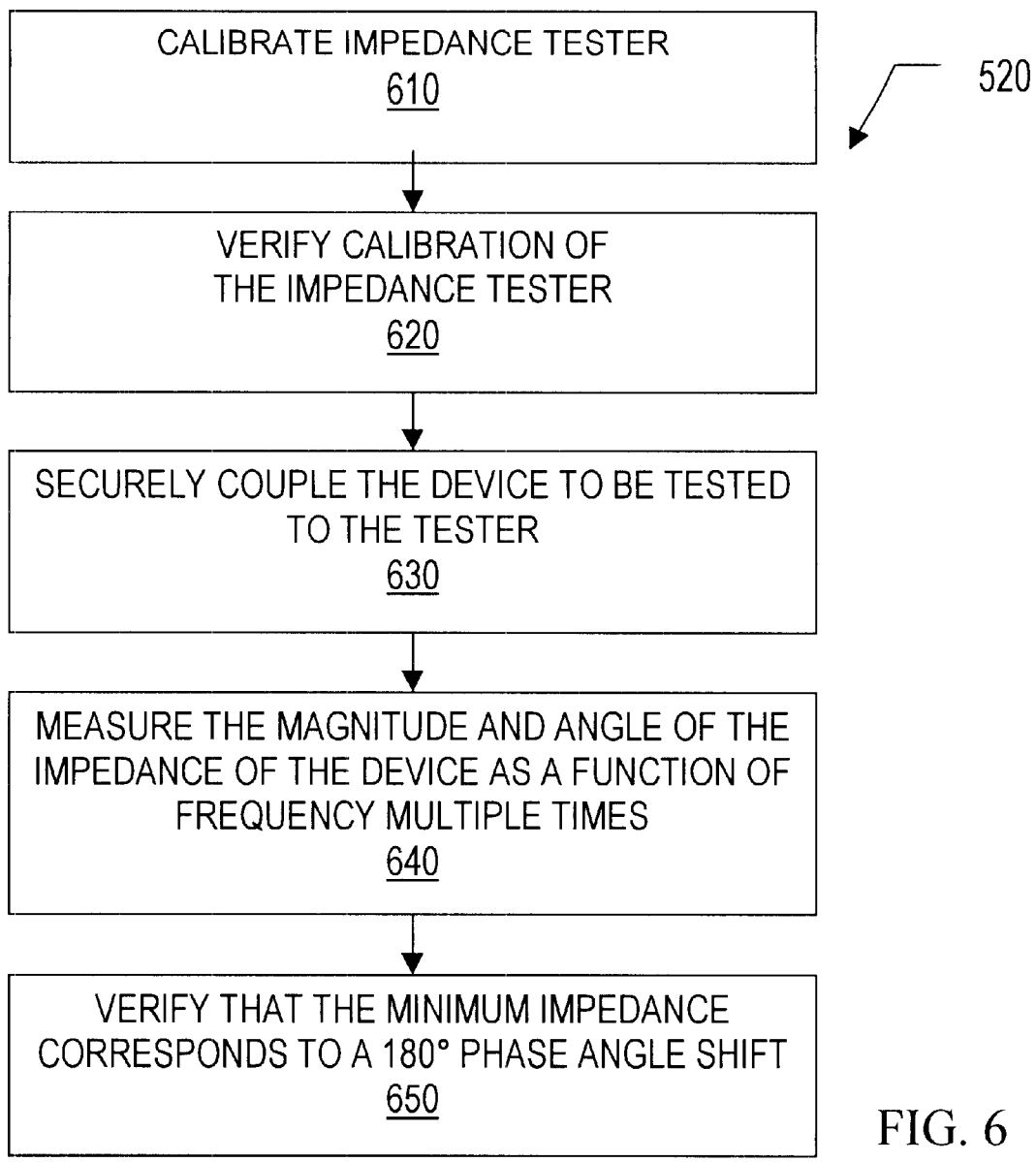
FIG. 6 is a flowchart of an embodiment of a method for measuring the equivalent series resistance of an electrical device.

FIG. 6—Method for Measuring ESR

FIG. 6 illustrates a flowchart of an embodiment of a method for measuring the ESR of an electrical device. The method comprises calibrating an impedance tester 610. Calibrating preferably comprises connecting the test heads to the impedance tester prior to all other work. In a preferred embodiment, the impedance tester is a HEWLETT-PACKARD model 4291A RF Impedance/Material Analyzer. The test heads preferably comprise a low impedance test head, an APC7 connector for the test head, and an adapter to couple APC7 to an SMA connector. Calibrating preferably involves three test cases using a 50 Ω load, a short, and an open circuit.

The method verifies 620 the calibration performed in 610 before mounting the electrical device. Verification preferably comprises comparing the expected smith chart reflection coefficient for each test case with the experimentally determined reflection coefficient. After the impedance test passes the calibration, the device is securely coupled to the impedance tester 630. Preferably, securely coupling the device to the tester comprises soldering the device to an SMA connector by connecting one side of the device to the central post and the other side of the device to the outer connector. In another embodiment, securely coupling the device to the tester comprises mounting the device on the tester in such a fashion that stray capacitances and inductances are mostly eliminated. The SMA connector is then mounted to the impedance tester.

The method measures the impedance of the device as a function of frequency over the desired frequency range 640. In a preferred embodiment, both the magnitude and the phase angle of the impedance are measured. Preferably, the measurement is repeated multiple times and the results averaged. The method then verifies the results of the measurements 650. Preferably, verification comprises comparing 180° to the phase angle shift at the frequency, at which the device has a minimum measured impedance value. If the phase shift at the frequency at which the device has a minimum measured impedance value is not 180° at an acceptable uncertainty, then the results are discarded and the method performed anew. If the phase shift at the frequency at which the device has a minimum measured impedance value is 180° at an accepted uncertainty, then the ESR of the device is the magnitude of the impedance at the frequency at which the device has a minimum measured impedance value is 180°. Although the method is shown in flowchart form, it is noted that portions of FIG. 6 may occur concurrently or in different orders.

In a preferred embodiment, measuring the impedance as a function of frequency is comprised as follows. Set the MAG ($|Z|$) and ($\theta_z$) from "Meas" under the dual parameter key on the IP 4291 A. Choose frequency range from 1 MHz to 1.8 GHz under the sweep button menu. Choose sweep type as logarithmic. Choose Marker search under search button and set it to minimum. Set marker search to on. Click on "Bw/Avg" menu under measurement block. Choose Sweep average and set average factor to 20. Hit sweep average start button to start taking measurements as a function of frequency. Note the minimum value after the averaging counter reaches 20. Repeat steps for each device.

Figure 7:
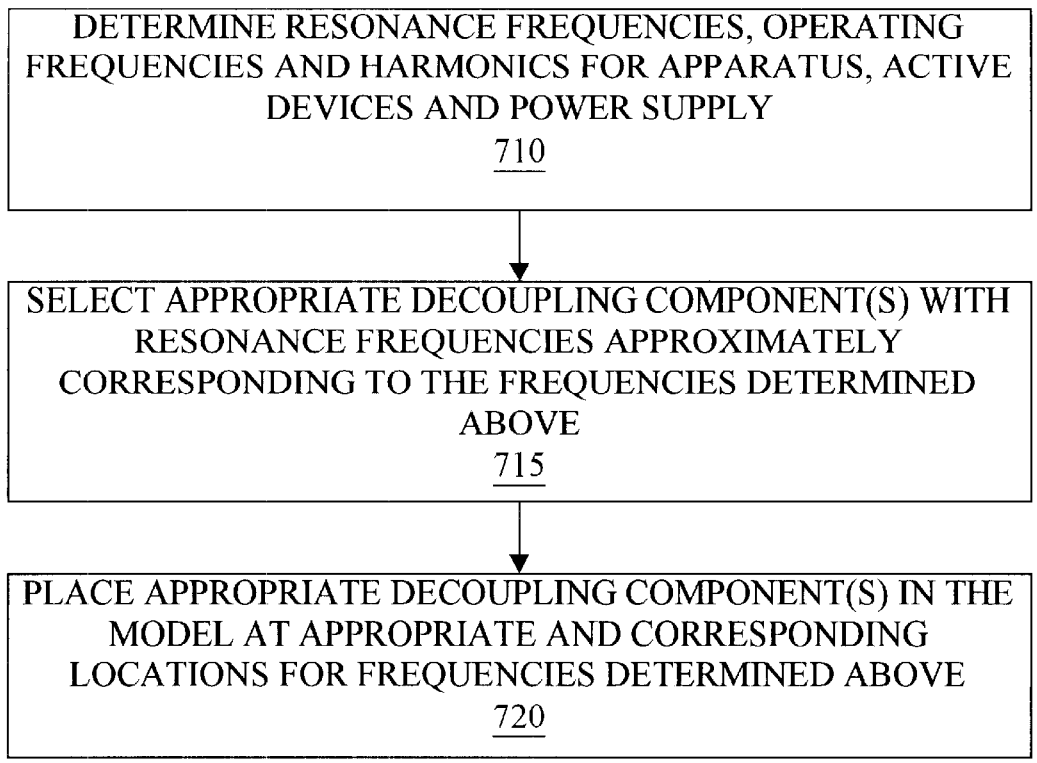
FIG. 7 is a flowchart of an embodiment of a method for placing decoupling components in a power distribution system.

FIG. 7—Method for Selecting and Placing Decoupling Components

FIG. 7 illustrates a flowchart of an embodiment of a method for selecting decoupling components and placing the decoupling components in a power distribution system. The method first determines resonance frequencies for the electrical interconnection apparatus, the active devices, and the power supply 710. Note that "resonance frequency" includes the operating frequencies and harmonics of the active devices and the power supply. Integer fractions of these frequencies may also be considered as resonance frequencies. The resonance frequencies of the electrical interconnection apparatus are also described as board resonance frequencies or board frequencies. The method then selects appropriate decoupling components 715. Appropriate decoupling components have approximately corresponding resonance frequencies to the system resonance frequencies determined in 710. The method next places the appropriate decoupling components in the model at appropriate and corresponding locations for the system resonance frequencies 720. After the model calculations are completed, the appropriate decoupling components will be placed on the electrical interconnection apparatus.

In various embodiments, the electrical interconnection apparatus may have one or more board resonance frequencies, with each of the board resonance frequencies corresponding to one or more particular dimensions of the electrical interconnection apparatus. Placement of a decoupling component 720 corresponding to a particular board resonance frequency is preferably at a location corresponding to the particular dimension in question.

In one embodiment, the method selects first decoupling components corresponding to the board resonance frequencies 715. In another embodiment, the method selects second decoupling components corresponding to the active device operating frequencies 715. In still another embodiment, the method selects third decoupling components corresponding to one or more harmonics of the active device operating frequencies 715. The method may also select additional decoupling components corresponding to additional board resonance frequencies, active device operating frequencies or harmonics, or interaction resonance frequencies 715.

In an embodiment where the electrical interconnection device has approximately a rectangular shape, the first dimension corresponds to an effective length and the second dimension corresponds to an effective width. The preferred locations for placing decoupling components corresponding to the board resonance frequencies for the first and second dimensions include the edges along the length and the width. A preferred location along the dimension includes the midpoint of the dimension.

In one embodiment, selecting appropriate decoupling components with resonance frequencies approximately corresponding to the resonance frequencies of the power distribution system 715 includes selecting the number of each of the decoupling components. The number of each of the decoupling components is chosen in one embodiment based upon the frequency range of interest and the impedance profiles of the plurality of possible decoupling components. In another embodiment, the numbers are chosen by a computer system. The computer system may access a database of values on the plurality possible decoupling components, including values for physical and/or electrical characteristics. Electrical characteristics included in the database may include rated capacitance, equivalent series resistance, and/or mounted inductance.

In another embodiment, the method for selecting decoupling components and placing the decoupling components in the model further comprises effectuating the model and determining the system impedance response at one or more selected locations. If the system impedance response at the one or more selected locations is above a target impedance, the method selects additional decoupling components in the proper frequency range. The method places the additional decoupling components in available locations. The available locations may be constrained due to existing devices on the electrical interconnection apparatus, including other decoupling components.

In still another embodiment, the method may include comparing an impedance of each particular one of the decoupling components chosen by the method to the target impedance. The method may further select a number of each particular one of a decoupling components to provide a total impedance at or below the target impedance as a part of selecting appropriate decoupling components 715. In yet another embodiment, the method selects decoupling components above the lowest board resonance frequency. In another embodiment, the method also selects decoupling components above a highest resonance frequency of the decoupling components. Additional details on selecting particular decoupling components and the number of each particular one of the decoupling components may be found elsewhere in this disclosure. Although the method is shown in flowchart form, it is noted that portions of FIG. 7 may occur concurrently or in different orders.

FIG. 8—Computer System and Method for Selecting Decoupling Components

Figure 8A:
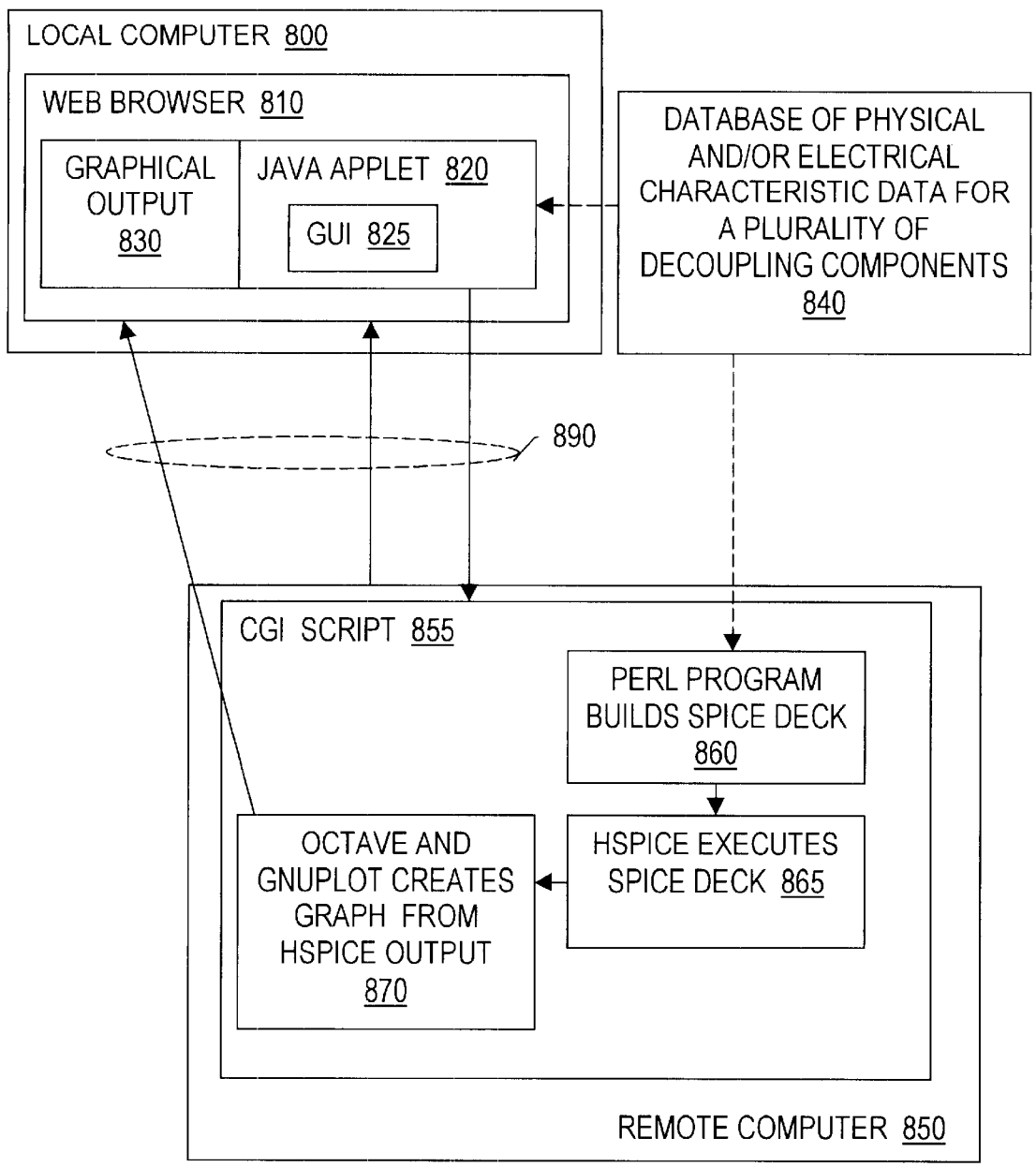
FIG. 8A is a block diagram of an embodiment of a computer system operable to implement the methods of determining the decoupling components for a power distribution system.

FIG. 8A illustrates a block diagram of an embodiment of a computer system for selecting decoupling components. As shown, the computer system includes a local computer 800 and a remote computer 850 coupled by a networking connection 890. In one embodiment, the local computer 800 and the remote computer 850 are unified as a single computer, where the networking connection 890 comprises a bus in the single computer. Both the local computer 800 and the remote computer 850 are operable to accept input from a database of physical and/or electrical characteristic data for a plurality of decoupling components 840. In various embodiments, the database may be comprised in the local computer 800 or in remote computer 850. In a preferred embodiment, the database is comprised in remote computer 850 and accessible to the local computer 800 through the networking connection 890. In another embodiment, the database 840 is comprised external to both the local computer 800 and the remote computer 850, such as on a database computer.

As shown, the local computer 800 is operable execute a first program, preferably a web browser 810. The web browser 810 is operable to run an interactive applet 820, preferably a JAVA applet, and to accept and display graphical output 830. Alternative embodiments may comprise a JavaScript program or HTML code. The JAVA applet 820 outputs component and placement data using the http POST method to the remote computer. The CGI script 855 receives the component and placement data and either includes or calls a PERL program to build a SPICE deck 860. In other embodiments, CORBA, remote method invocation (RMI), or other methods may be used. The SPICE deck output of the PERL program 860 is sent to a simultaneous-equation-solver program, preferably a SPICE simulator such as HSPICE (available from Avant! Corporation, Fremont, Calif.), which executes the SPICE deck 865. The HSPICE output is preferably converted by OCTAVE and GNUPlot into a graph 870. The graph from 870 is preferably sent from the remote computer 850 to the local computer 800 to be displayed as graphic output 830 in the web browser 810. The actions of the CGI script 855 may also be performed by a second program. In one embodiment, the second program comprises the simultaneous-equation-solver program. In another embodiment, the simultaneous equation solver program comprises a circuit-solver program. Other embodiments of the second programs are also contemplated, including custom hardware or software.

FIG. 8B illustrates a flowchart of an embodiment of a method for determining decoupling components for a power distribution system, preferably using the computer system of FIG. 8A. Actions 801 (above the line) preferably take place on the local computer 800. Actions 851 (below the line) preferably take place on the remote computer 850. In one embodiment, the actions 801 and 851 all take place in a single computer system. In another embodiment, the actions 801 and 851 take place outside the computer system. Systems parameters are defined in 806. Preferably, the system parameters include power supply voltage, allowable power supply ripple, total current consumption, power supply poll frequency, power supply zero frequency, first and second power supply resistances, physical dimensions of the electrical interconnection device, dielectric thickness and constant metalization thickness of the electrical interconnection device, and the frequency range of interest.

The system parameters defined in 806 are used to calculate values for the target impedance and one or more board resonance frequencies 807. Configuration parameters are defined in 821. The integration parameters preferably include weighting factors and mounted inductances for the plurality of decoupling components. For purposes of this disclosure, mounted inductance refers to a loop inductance based on the geometry of the decoupling components, pad geometry, distance to the power planes, and the location on the power planes. Values are extracted from the database of various physical and/or electrical characteristics for a plurality of decoupling components 841. As shown, the database preferably includes the capacitance and ESR for the plurality of possible decoupling components.

The calculated values 807, the configuration definitions 821, and the database values 841 are input to calculate the decoupling component resonance frequencies, and the optimum number of each chosen decoupling component 822. In one embodiment, the optimum number of each chosen decoupling component chosen for given frequency is the ESR of the decoupling component divided by the target impedance multiplied by the weighting factor. The decoupling component frequencies are preferably calculated using the equation given above.

Spatial placements for decoupling components, current sources, power supply, and selected locations or probe points are chosen in 823, preferably by a user. Further details on placing the decoupling components in the model of the power distribution system are given elsewhere in this disclosure. Spatial placement data 823 and system parameter definitions 806 are combined into spatial placement data, inductance data, electric interconnection device data, and power supply data 824 to be sent to the remote computer 850.

The data that were sent to the remote computer 824 are used to build a SPICE deck 861. The SPICE deck is used as input for a SPICE analysis 866, preferably using HSPICE. Output from the SPICE analysis 866 is processed to create graphical output 871. The graph the output returned to the local computer 872, preferably to the web browser 810. The graphic display is preferably displayed on the local computer 826, preferably as an HTML page in the web browsers 810. In one embodiment, the HTML page comprises an SGML page, or other program as desired. Although the method is shown in flowchart form, it is noted that portions of FIG. 8B may occur concurrently or in different orders.

Figure 9:
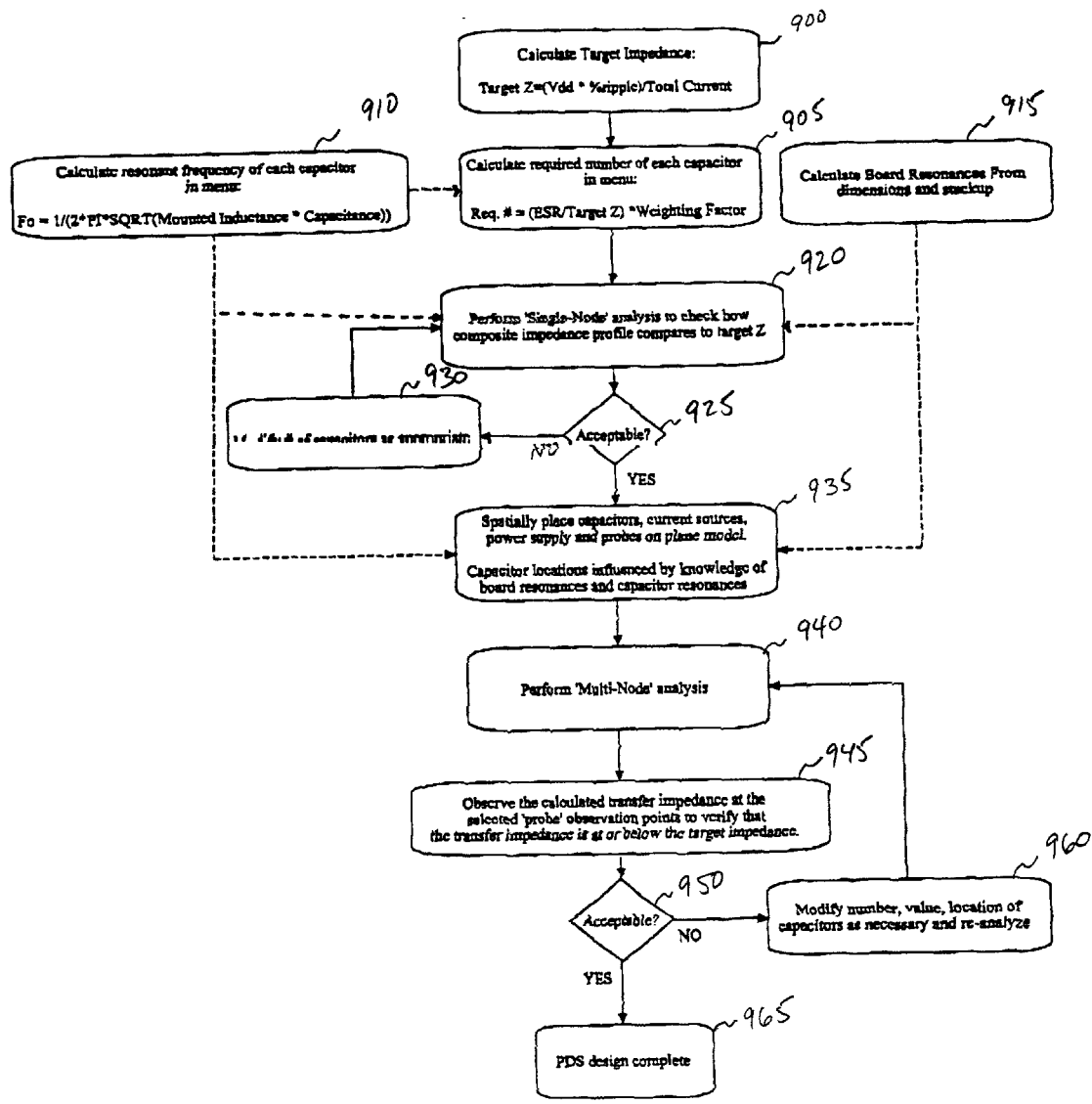
FIG. 9 is a flowchart of another embodiment of the method for determining decoupling components for a power distribution system using the computer system of FIG. 8A.

FIG. 9—Another Embodiment of the Computerized Method

FIG. 9 illustrates a flowchart of an embodiment of a computerized method for determining the decoupling components for a power distribution system. As shown, the method calculates the target impedance for the power distribution system 900. The target impedance is preferably calculated as a power supply voltage times the allowable power supply ripple divided by the total current. In a preferred embodiment, the total current is normalized to one ampere. The calculated target impedance is used to calculate an optimum number of each available decoupling component 905. The optimum number is preferably defined as the ESR of the decoupling component divided by the target impedance multiplied by the weighting factor. The method also calculates the resonance frequency of each available decoupling component 910. The resonance frequency is preferably calculated as the inverse of two pi multiplied by the square root of the product of the mounted inductance and the capacitance of the decoupling component. The method also calculates board resonance frequencies 915, preferably based upon the dimensions of the electrical interconnection device and stackup on the electrical interconnection device.

Figure 2:
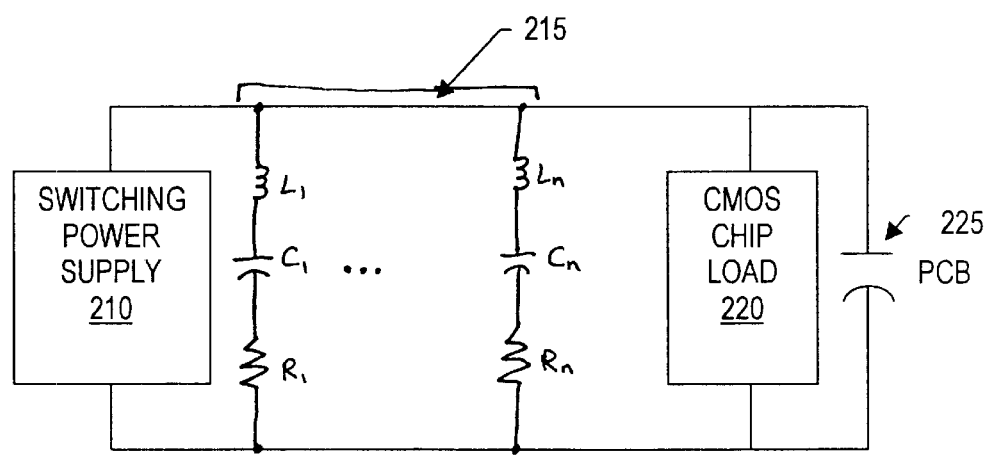
FIG. 2 is an embodiment of a prior art single node model of a power distribution system.

The method performs single node analysis to compare the composite impedance profile of the electrical interconnection device, including decoupling components, to target impedance. In single node analysis, spatial locations are not taken into account, as in the model illustrated in FIG. 2. The method next compares the results of the single node analysis to the target impedance 925 to determine, if the composite impedance profile of the electrical interconnection device is acceptable. Acceptable is preferably defined as the target composite impedance profile being at or below the target impedance. If the composite impedance profile of the electrical interconnection device is not acceptable, the method varies one or more of the input parameters 930 and again performs single node analysis 920.

If the composite impedance profile of the electrical interconnection device after single node analysis is acceptable 925, then the method proceeds to spatially place the decoupling components, the current sources, the power supply, and the specific probe locations in the model 935. The locations chosen for devices placed in the model are preferably influenced by the board resonance frequencies 910 and the capacitor resonance frequencies 915. Additional details on placing decoupling opponents for the power distribution system are given elsewhere in this disclosure.

The method next performs multi-node analysis 940. In a preferred embodiment, multi-node analysis corresponds to performing HSPICE analysis 866. The results of the multi-node analysis are observed 445. If the results are acceptable in 950, the power distribution design is considered complete 965. The preferred criteria for accepting the results of the multi-node analysis are that the system transfer impedance is below the target impedance over the frequency range of interest. Should results not be acceptable in 950, method modifies the choice of the decoupling components, the number of each the decoupling opponents, and/or placement of the decoupling components 960 and reanalyzes the model using multi-node analysis 940. Although the method is shown in flowchart form, it is noted that portions of FIG. 9 may occur concurrently or in different orders.

Numerous variations and modifications will become apparent to those skilled in the art once the above disclosure is fully appreciated. It is intended that the following claims be interpreted to embrace all such variations and modifications.

What is claimed is:

1. A system for determining the decoupling capacitors for a power distribution system, the system comprising:
    a database of electrical characteristic values for a plurality of decoupling capacitors;
    a computer system configured to execute a simultaneous equation solver program, wherein execution of the simultaneous equation solver program includes:
        creating a model of the power distribution system, the power distribution system including a power supply, wherein the model of the power distribution system is based on a plurality of cells interconnected at predetermined nodes and arranged in an M×N grid for a power plane and a corresponding reference plane, and wherein the power supply is characterized in the model by one or more pole frequencies, one or more zero frequencies, and one or more resistances;
        selecting one or more decoupling capacitors from the database and calculating a specific quantity of selected decoupling capacitors;
        updating the model to include the electrical characteristics of the one or more decoupling capacitors, wherein said updating includes determining and simulating the placement of the selected decoupling capacitors between the power plane and the ground plane;
        determining the transfer impedance values at the predetermined nodes, wherein the predetermined nodes correspond to specific locations in the power distribution system;
        comparing the transfer impedance values at the predetermined nodes to a predetermined target impedance; wherein the target impedance is selected based on one or more of the following:
            power supply voltage;
            total current consumption by an electronic circuit coupled to the power supply; and
            allowable voltage ripple; and
        repeating said selecting, said updating, said determining, and said comparing until each of the transfer impedance values is at or below the target impedance.

2. The system as recited in claim 1, wherein the computer system is further configured to output one or more of the following:
    results from said determining the transfer impedance values;
    results from said comparing the transfer impedance values;

results from said selecting one or more decoupling capacitors;

results from said determining and simulating the placement of the selected decoupling capacitors; and one or more electrical characteristics of the power distribution system.

3. The system as recited in claim 2, wherein an output from the computer system is displayed on a web browser.

4. The system as recited in claim 1, wherein execution of the simultaneous equation solver program further includes configuring the model to simulate current sources and current sinks in the power distribution system.

5. The system as recited in claim 4, wherein the current sources and current sinks represent active components, said active components including one or more of the following: processors, memories, application specific integrated circuits (ASICs), or logic IC's.

6. The system as recited in claim 5, wherein each of the plurality of cells in the model of the power distribution system is based on electrical characteristics of the power distribution system, wherein the power distribution system includes a printed circuit board, wherein the model include the attributes of the printed circuit board.

7. The system as recited in claim 6, wherein each of the cells is modeled by electrical characteristics corresponding to one or more transmission lines and one or more resistors.

8. The system as recited in claim 7, wherein each of the transmission lines is characterized by at least one impedance value and at least one time delay value, wherein the impedance value and the time delay value are based upon physical dimensions of the power distribution system.

9. The system as recited in claim 1, wherein the electrical characteristic values for the plurality of decoupling capacitors includes:

a capacitance value for each of the plurality of decoupling capacitors;

a mounted inductance value for each of the plurality of decoupling capacitors; and an equivalent series resistance value for each of the decoupling capacitors.

10. The system as recited in claim 9, wherein a specific quantity of decoupling capacitors for a given frequency is determined based on a formula $Q=ESR/Z_T$, wherein ESR is the equivalent series resistance of a selected decoupling capacitor for the given frequency, $Z_T$ is the target impedance, and Q is the quotient obtained from the formula.

11. The system as recited in claim 10, wherein Q is rounded up to the next highest integer value.

12. The system as recited in claim 1, wherein M and N are integers of equal value.

13. The system as recited in claim 1, wherein the model of the power distribution system is a mathematical model.

14. The system as recited in claim 13, wherein the model of the power distribution system is a SPICE model.

15. A method for determining the decoupling capacitors for a power distribution system, the method comprising:

a computer system executing a simultaneous equation solver program, wherein execution of the simultaneous equation solver program includes:

creating a model of the power distribution system, the power distribution system including a power supply, wherein the model of the power distribution system is based on a plurality of cells interconnected at predetermined nodes and arranged in an M×N grid for a power plane and a corresponding reference plane, and wherein the power supply is characterized in the model by one or more pole frequencies, one or more zero frequencies, and one or more resistances;

selecting one or more decoupling capacitors from a database and calculating a specific quantity of selected decoupling capacitors, the database including a plurality of electrical characteristic values for a plurality of decoupling capacitors;

updating the model to include the electrical characteristics of the one or more decoupling capacitors, wherein said updating includes determining and simulating the placement of the selected decoupling capacitors between the power plane and the ground plane;

determining the transfer impedance values at the predetermined nodes, wherein the predetermined nodes correspond to specific locations in the power distribution system;

comparing the transfer impedance values at the predetermined nodes to a predetermined target impedance; wherein the target impedance is selected based on one or more of the following:

power supply voltage;

total current consumption by an electronic circuit coupled to the power supply; and allowable voltage ripple; and repeating said selecting, said updating, said determining, and said comparing until each of the transfer impedance values is at or below the target impedance.

16. The system as recited in claim 15, wherein the computer system is further configured to output one or more of the following:

results from said determining the transfer impedance values;

results from said comparing the transfer impedance values;

results from said selecting one or more decoupling capacitors;

results from said determining and simulating the placement of the selected decoupling capacitors; and one or more electrical characteristics of the power distribution system.

17. The method as recited in claim 15, wherein an output from the computer system is displayed on a web browser.

18. The method as recited in claim 15, wherein execution of the simultaneous equation solver program further includes configuring the model to simulate current sources and current sinks in the power distribution system.

19. The method as recited in claim 18, wherein the current sources and current sinks represent active components, said active components including one or more of the following: processors, memories, application specific integrated circuits (ASICs), or logic IC's.

20. The method as recited in claim 15, wherein each of the plurality of cells in the model of the power distribution system is based on electrical characteristics of the power distribution system, wherein the power distribution system includes a printed circuit board, wherein the model include the attributes of the printed circuit board.

21. The method as recited in claim 20, wherein each of the cells modeled is by electrical characteristics corresponding to one or more transmission lines and one or more resistors.

22. The method as recited in claim 21, wherein each of the transmission lines is characterized by at least one impedance value and at least one time delay value, wherein the impedance value and the time delay value are based upon physical dimensions of the power distribution system.

23. The method as recited in claim 15, wherein the electrical characteristic values for the plurality of decoupling capacitors includes:
- a capacitance value for each of the plurality of decoupling capacitors;
- a mounted inductance value for each of the plurality of decoupling capacitors; and
- an equivalent series resistance value for each of the decoupling capacitors.

24. The method as recited in claim 23, wherein a specific quantity of decoupling capacitors for a given frequency is determined based on a formula $Q=ESR/Z_T$, wherein ESR is the equivalent series resistance of a selected decoupling capacitor for the given frequency, $Z_T$ is the target impedance, and Q is the quotient obtained from the formula.

25. The method as recited in claim 24, wherein Q is rounded up to the next highest integer value.

26. The method as recited in claim 15, wherein M and N are integers of equal value.

27. The method as recited in claim 15, wherein the model of the power distribution system is a mathematical model.

28. The method as recited in claim 27, wherein the model of the power distribution system is a SPICE model.

* * * * *